(12) United States Patent
Bolotov et al.

(10) Patent No.: US 8,832,532 B2
(45) Date of Patent: Sep. 9, 2014

(54) DYNAMICALLY CONTROLLING THE NUMBER OF LOCAL ITERATIONS IN AN ITERATIVE DECODER

(75) Inventors: Anatoli A. Bolotov, San Jose, CA (US); Aleksey Alexandrovich Letunovskiy, Tokarevka (RU); Ivan Leonidovich Mazurenko, Khimki (RU); Lav D. Ivanovic, Sunnyvale, CA (US); Fan Zhang, Milpitas, CA (US)

(73) Assignee: LSI Corporation, San Jose, CA (US)

( * ) Notice: Subject to any disclaimer, the term of this patent is extended or adjusted under 35 U.S.C. 154(b) by 164 days.

(21) Appl. No.: 13/528,237

(22) Filed: Jun. 20, 2012

(65) Prior Publication Data

US 2013/0346824 A1  Dec. 26, 2013

(51) Int. Cl.
*H03M 13/00* (2006.01)

(52) U.S. Cl.
USPC .......................................... 714/774

(58) Field of Classification Search
CPC combination set(s) only.
See application file for complete search history.

(56) References Cited

U.S. PATENT DOCUMENTS

2009/0307566 A1* 12/2009 No et al. .................. 714/784
2010/0042891 A1*  2/2010 Gunnam et al. ........... 714/752

* cited by examiner

*Primary Examiner* — Guerrier Merant
(74) *Attorney, Agent, or Firm* — Mendelsohn, Drucker & Dunleavy, P.C.; Craig M. Brown; Steve Mendelsohn

(57) ABSTRACT

An iterative decoder dynamically controls the number of local iterations of error-correction decoding performed for each global iteration of channel detection. In so doing, the iterative decoder (i) limits the number of local iterations that are performed after error-correction decoding has likely encountered a trapping set and (ii) permits decoding to continue when error-correction decoding is on the path to converging on a valid codeword. To predict whether error-correction decoding is on the path to encountering a trapping set or converging on a valid codeword, a model is generated based on observed numbers of unsatisfied check nodes for a specified number of local iterations. For local iterations following the specified number of local iterations, the observed numbers of unsatisfied check nodes are then compared to the model to determine whether to continue or terminate local iterations of error-correction decoding.

19 Claims, 4 Drawing Sheets

DYNAMICALLY CONTROLLING THE NUMBER OF LOCAL ITERATIONS IN AN ITERATIVE DECODER

SUMMARY

One embodiment of the invention is a processor implemented method for performing one or more global iterations of decoding to recover a valid codeword from a received signal. The method comprises steps (a)-(d). In step (a), for each global iteration, channel detection is performed on the received signal to generate a set of channel soft-output values, wherein each soft-output value corresponds to a different bit of the valid codeword. In step (b), for each global iteration, a first local iteration of error-correction decoding is performed on the set of channel soft-output values to generate a set of updated soft-output values. In step (c), for each global iteration, one or more subsequent local iterations of error-correction decoding is performed, wherein, for each subsequent local iteration of error-correction decoding, error-correction decoding is performed on a set of updated soft-output values generated during a previous local iteration of error-correction decoding to modify the set of updated soft-output values. In step (d), how may subsequent local iterations of error-correction decoding are performed when error-correction decoding does not generate the valid codeword is dynamically controlled.

Another embodiment of the present invention is an apparatus comprising an iterative decoder adapted to perform one or more global iterations of decoding to recover a valid codeword from a received signal. The iterative decoder comprises a channel detector adapted to implement step (a), an error-correction decoder adapted to implement steps (b) and (c), and a controller adapted to implement step (d).

BRIEF DESCRIPTION OF THE DRAWINGS

Embodiments of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Figure 1:
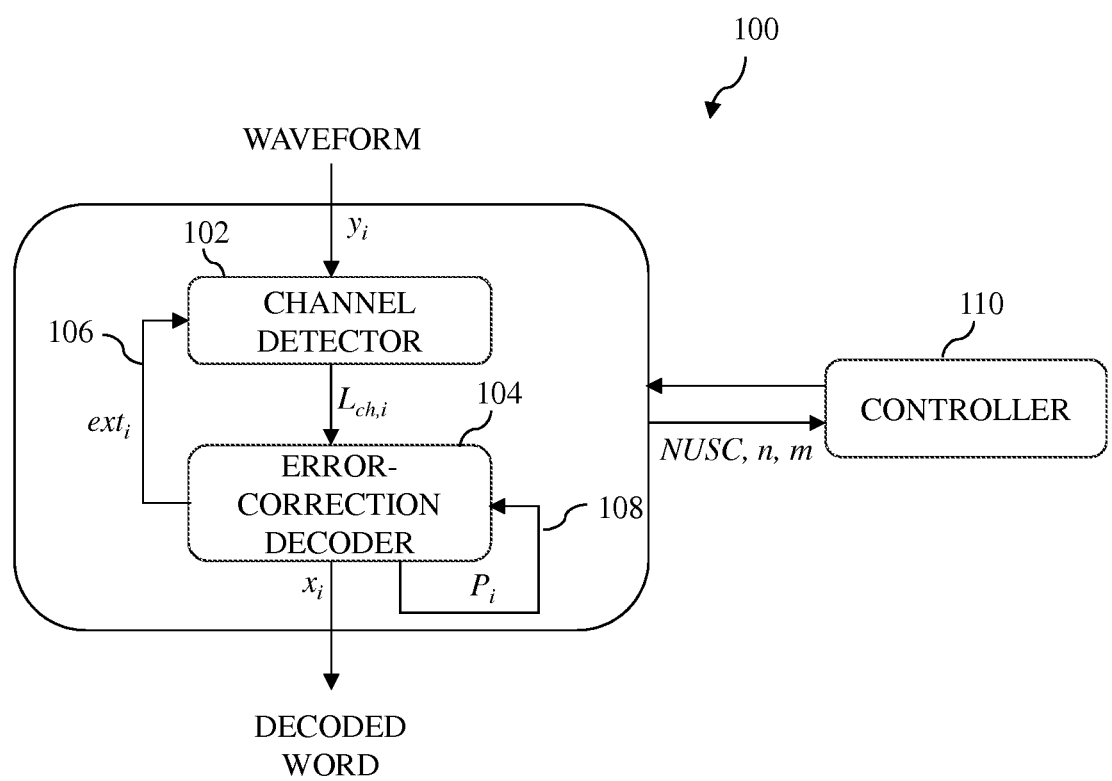
FIG. 1 shows a simplified block diagram of an iterative decoder according to one embodiment of the disclosure.

FIG. 1 shows a simplified block diagram of an iterative decoder 100 according to one embodiment of the disclosure. Iterative decoder 100, which comprises at least one channel detector 102 and at least one error-correction decoder 104, may be implemented in many different ways, and the details of iterative decoder 100 are provided merely to illustrate the basic components of an iterative decoder. Note that, as used herein, the term "iterative decoder" refers to a decoder, such as a turbo equalizer, that implements both channel detection and error-correction decoding one or more times for each decoding operation.

In general, iterative decoder 100 receives an input waveform from, for example, a storage medium, such as a hard-disk drive platter, or a transmission medium, such as airwaves or copper wires. The input waveform corresponds to an error-correction-encoded codeword that was encoded by a transmitter and stored on the storage medium or transmitted over the transmission medium. The input waveform may be pre-processed using processing (not shown) such as amplification, analog-to-digital conversion, finite-impulse-response (FIR) filtering, equalization, and possibly other processing suitable for preparing the waveform for channel detection and error-correction decoding.

Digital samples $y_i$ of the waveform are provided to channel detector 102, which implements a suitable detection technique, such as Viterbi soft-output detection or maximum a posteriori (MAP) detection, to generate an initial soft-output digital value $L_{ch,i}$ (e.g., a log-likelihood ratio (LLR)) corresponding to each bit i of the error-correction-encoded codeword. Note that, as used in this specification, the term "soft-output value" refers to a multi-bit value comprising a hard-decision bit (e.g., the most-significant bit) and one or more confidence value bits (e.g., the least-significant bits).

The initial soft-output values $L_{ch,i}$ are provided to error-correction decoder 104, which implements an iterative error-correction decoding scheme, such as low-density parity-check (LDPC) decoding, to recover the original error-correction-encoded codeword. During each local iteration of error-correction decoder 104, error-correction decoder 104 generates a set of updated soft-output values $P_i$, each value $P_i$ corresponding to one bit i of the error-correction-encoded codeword. A local iteration is an iteration that is performed within error-correction decoder 104 itself, and does not involve repetition of channel detection between successive iterations of error-correction decoder 104. As shown in FIG. 1, iterative decoder 100 supports both local iterations and global iterations, in which channel detection is implemented between successive iterations of error-correction decoder 104.

Upon generating a set of updated soft-output values $P_i$, error-correction decoder 104 performs a parity check using the hard-decision bits $x_i$ of the updated soft-output values $P_i$ to determine whether error-correction decoder 104 has converged on a valid codeword. In LDPC decoding, the parity check is performed by multiplying a vector $\hat{x}$, formed from the set of hard-decision bits $x_i$, by the transpose $H^T$ of the LDPC parity-check matrix (i.e., H-matrix) used to generate the error-correction-encoded codeword. The resulting product is a vector, often referred to as the syndrome, and each bit of the syndrome corresponds to one row (i.e., check node) of the LDPC parity-check matrix. If one or more elements of the resulting syndrome is equal to one (i.e., $\hat{x}H^T \neq 0$), then error-correction decoder 104 has not converged on a valid codeword. Each element of the syndrome that has a value of one is considered an unsatisfied check node, and each element of the syndrome that has a value of zero is either (i) a satisfied check node or (ii) a missatisfied check node (i.e., a check node that falsely shows as satisfied).

If each element of the resulting syndrome is equal to zero (i.e., $\hat{x}H^T = 0$), then error-correction decoder 104 has converged on a valid codeword. In this case, the hard-decision bits $x_i$ are output to downstream processing (not shown). The valid codeword could have one or more mis-satisfied check nodes, and as a result, downstream processing may perform a cyclic-redundancy check (CRC) to determine whether the valid codeword is the correct codeword (i.e., the codeword that was transmitted).

If error-correction decoder 104 does not initially generate a valid codeword, then error-correction decoder 104 performs one or more additional local iterations 108 using the most-recent set of updated soft-output values $P_i$ in place of the original set of soft-output values $L_{ch,i}$ in an attempt to converge on a valid codeword. The number of local iterations performed by error-correction decoder 104 is controlled by controller 110.

When performing the one or more local iterations 108, error-correction decoder 104 could encounter a trapping set. Trapping sets, which represent subgraphs in a Tanner graph of an error-correction code, typically have a strong influence on error-floor characteristics of the error-correction code because a trapping set may force the decoder to converge to an incorrect result. A trapping set may be defined as a set of w bit nodes that converges on a syndrome having a set of v odd-degree check nodes (i.e., unsatisfied check nodes) and an arbitrary number of even-degree check nodes (i.e., satisfied and/or missatisfied check nodes). A trapping set may be caused by the passing of incorrect information between the check nodes and variable nodes, where each variable node corresponds to a different column of the parity-check matrix (i.e., a different bit of the codeword).

To break the trapping set, one or more additional global iterations 106 of iterative decoder 100 may be performed. A global iteration is an iteration of iterative decoder 100 that includes channel detection and error-correction decoding. Iterative decoder 100 performs additional global iterations until either (i) iterative decoder 100 converges on a valid codeword or (ii) iterative decoder 100 completes a specified maximum number $M_{max}$ of global iterations, whichever occurs first. The maximum number $M_{max}$ is typically fixed to a predefined value (e.g., $M_{max}$=3-5) known a priori to the decoder. Note that each global iteration, other than perhaps the last global iteration performed, will contain $N_{max}$ local iterations.

To perform an additional global iteration 106, error-correction decoder 104 generates an extrinsic soft-output value $Ext_i$ for each bit i of the error-correction-encoded codeword as shown in Equation (1) below:

$$Ext_i = P_i - L_{ch,i} \quad (1)$$

where $P_i$ are the most-recent set of updated soft-output values. The extrinsic soft-output values $Ext_i$ are provided to channel detector 102, which performs another iteration of channel detection on the samples $y_n$ of the equalized, retrieved data stream, which are stored by iterative decoder 100 (not shown) during the first global iteration. In so doing, channel detector 102 uses the extrinsic soft-output values $Ext_i$ to improve detection. For example, in Viterbi detection, the extrinsic soft-output values $Ext_i$ are used to improve the branch-metric calculation. Additionally, channel detector 102 uses the extrinsic soft-output values $Ext_i$ to calculate new channel soft-output values $L_{ch,i}$ as shown in Equation (2) as follows:

$$L_{ch,i} = Pdet_i - Ext_i \quad (2)$$

where $Pdet_i$ is an updated soft-output value generated by channel detector 102 for each bit i of the error-correction-encoded codeword. The newly calculated channel soft-output values $L_{ch,i}$ are then decoded using error-correction decoder 104.

If iterative decoder 100 does not converge on a valid codeword within $M_{max}$ global iterations, then further processing is needed to recover the codeword. For example, the received data may be re-transmitted over the transmission medium or re-read from the storage medium, or some other method may be used to break a trapping set. Typically, such further processing causes a relatively long delay. In some cases, error-correction decoder 104 might not be capable of recovering the correct codeword due to, for example, an excessively large flaw on a hard-disk platter or excessive noise in the communication channel.

For each global iteration, controller 110 could control the number of local iterations performed by error-correction decoder 104 so that error-correction decoder 104 performs local iterations until either (i) error-correction decoder 104 converges on a valid codeword or (ii) error-correction decoder 104 completes a specified maximum number $N_{max}$ (e.g., 20) local iterations, whichever occurs first. Further, controller 110 could control the number of global iterations performed by iterative decoder 100 so that iterative decoder 100 performs global iterations until either (i) iterative decoder 100 converges on a valid codeword or (ii) iterative decoder 100 completes a specified maximum number $M_{max}$ (e.g., 3) global iterations, whichever occurs first. This scenario is illustrated in FIG. 2.

Figure 2:
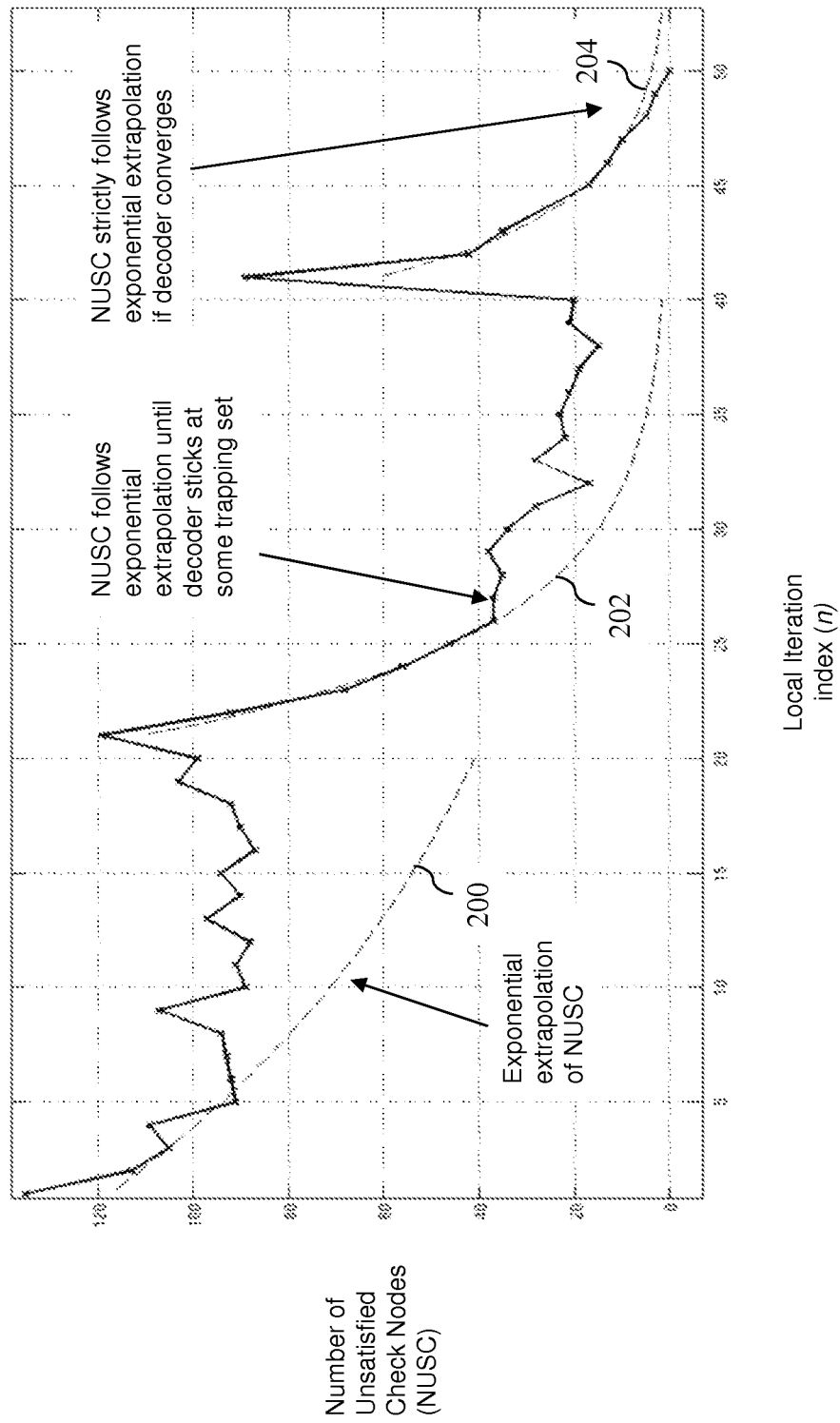
FIG. 2 graphically illustrates an exemplary decoding operation for an exemplary codeword.

FIG. 2 graphically illustrates an exemplary decoding operation for an exemplary codeword. The local iteration index n is plotted on the horizontal axis and the observed number NUSC of unsatisfied check nodes is plotted on the vertical axis. During a first global iteration, which corresponds to local iterations n=1, . . . , 20, the observed numbers NUSC of unsatisfied check nodes follow a trajectory that decreases relatively significantly from about NUSC=135 unsatisfied check nodes at local iteration n=1 to about NUSC=90 unsatisfied check nodes at local iteration n=5. Between local iterations n=6 and n=20, the observed numbers NUSC of unsatisfied check nodes follow a trajectory that does not continue to decrease, but rather appears to level off, indicating that the error-correction decoder has likely converged on a trapping set. Since the error-correction decoder does not converge on a valid codeword (i.e., the number of unsatisfied check nodes is not zero) within the $N_{max}$=20 maximum local iterations of the first global iteration, a second global iteration is performed after local iteration n=20 as indicated by the peak at local iteration n=21.

During the second global iteration, which corresponds to local iterations n=21, . . . , 40, the observed numbers NUSC of unsatisfied check nodes follow a trajectory that decreases relatively significantly from about NUSC=120 unsatisfied check nodes at local iteration n=21 to about NUSC=18 unsatisfied check nodes at local iteration n=32. Between local iterations n=33 and n=40, the observed numbers NUSC of unsatisfied check nodes follow a trajectory that does not continue to decrease at the same rate, but rather appears to level off, indicating that the error-correction decoder has likely converged again on a trapping set. Since the error-correction decoder does not converge on a valid codeword within the $N_{max}$=20 maximum local iterations of the second global iteration, a third global iteration is performed after local iteration n=40 as indicated by the peak at local iteration n=41.

During the third global iteration, which corresponds to local iterations n=41, . . . , 50, the observed numbers NUSC of unsatisfied check nodes follow a trajectory that decreases from about NUSC=90 unsatisfied check nodes at local iteration n=41 to NUSC=0 unsatisfied check nodes at local iteration n=50. Since, at local iteration n=50, the NUSC=0, the error-correction decoder has converged on a valid codeword and decoding is stopped.

FIG. 2 illustrates that, in some cases, the use of a predefined, fixed maximum number $N_{max}$ of local iterations can lead to some local iterations being performed needlessly. For example, in the first global iteration of FIG. 2, after the trajectory of the numbers NUSC of unsatisfied check nodes levels off (e.g., after local iteration n=5), the error-correction decoder has likely encountered a trapping set and therefore has little to no hope of converging on a valid codeword. Thus, after local iteration n=5, the error-correction decoder performs 15 additional local iterations (i.e., local iterations n=6 to n=20) that have little or no chance of converging on a valid codeword. Similarly, in the second global iteration, after the trajectory of the numbers NUSC of unsatisfied check nodes levels off (e.g., after local iteration n=26), the error-correction decoder performs 14 additional local iterations (i.e., local iterations n=27 to n=40) that have little or no chance of converging on a valid codeword. Each local iteration that is performed after the error-correction decoder has encountered a trapping set expends computational resources and processing power when the error-correction decoder has no change of converging on a valid codeword.

Although not shown in FIG. 2, in some cases, using a predefined maximum number $N_{max}$ of local iterations can also lead to error-correction decoding being stopped prematurely. In these cases, the error-correction decoder may be on the path to converging on a valid codeword, when error-correction decoder completes the maximum number $N_{max}$ of local iterations. However, rather than continuing error-correction decoding to converge on the valid codeword, another global iteration is unnecessarily performed if the iterative decoder has not completed the maximum number $M_{max}$ of global iterations. Worse yet, if the iterative decoder has completed the maximum number $M_{max}$ of global iterations, then processing is stopped completely. In such cases, further processing, such as re-reading or re-transmitting the data, is necessary to recover the codeword. This further processing causes an undue delay in recovering the codeword and expends computational resources and processing power that would not be necessary if error-correction decoding were permitted to continue.

Thus, when selecting a predefined maximum number $N_{max}$ of local iterations, two objectives are in tension: (1) reducing the number of local iterations that are performed when the error-correction decoder encounters a trapping set and (2) preventing the error-correction decoder from being stopped prematurely when the error-correction decoder is on the path to converging on a valid codeword. On the one hand, setting the predefined maximum number $N_{max}$ of local iterations to a larger value may prevent the error-correction decoder from being stopped prematurely during some decoding operations. However, this may result in an excessive number of local iterations being performed during other decoding operations in which the error-correction decoder encounters a trapping set. On the other hand, setting the predefined maximum number $N_{max}$ of local iterations to a smaller value may prevent an excessive number local iterations from being performed during decoding operations in which the error-correction decoder encounters a trapping set. However, this may also result in the error-correction decoder being stopped prematurely during decoding operations in which the error-correction decoder is on the path to converging on a valid codeword.

Rather than attempting to select a predefined maximum number $N_{max}$ of local iterations that balances these opposing objectives, controller 110 dynamically controls the number of local iterations performed in each global iteration based on the observed number NUSC of unsatisfied check nodes for each local iteration 108 performed. In so doing, the number of local iterations that are performed after error-correction decoding has likely encountered a trapping set may be limited. This allows the maximum number $N_{max}$ of local iterations to be set to a relatively large value (e.g., 100 or even infinity) so that the chances of error-correction decoding being prematurely stopped when the error-correction decoder is on the path to converging on a valid codeword are minimized. Note that the observed number NUSC of unsatisfied check nodes and the local iteration n index may be provided to controller 110 or controller 110 may keep track of the local iteration n index and determine the observed number NUSC of unsatisfied check nodes based on the syndrome.

To predict whether error-correction decoder 104 has likely encountered a trapping set or is converging on a valid codeword, controller 110 uses a model that is generated based on the observed numbers NUSC of unsatisfied check nodes for a specified number K (e.g., 5) of local iterations. This model may be understood with reference to FIG. 2, which shows three curves: curve 200 corresponding to the first global iteration, curve 202 corresponding to the second global iteration, and curve 204 corresponding to the third global iteration. All three curves may be defined by a negative exponential function as shown in Equation (3):

$$NUSC\_extr(n)=\exp(-An+B), \qquad (3)$$

where coefficients A and B are positive real numbers that vary from one curve to the next and n is the index for the local iterations in the current global iteration.

As illustrated by curve 204, when error-correction decoding converges on a valid codeword, the observed numbers NUSC of unsatisfied check nodes follow a trajectory that conforms to the negative exponential function (i.e., follows the trajectory of curve 204). However, as illustrated by curves 200 and 202, when error-correction decoding encounters a trapping set, the observed numbers NUSC of unsatisfied check nodes follow a trajectory that does not conform to the negative exponential function (i.e., does not follow the trajectories of curves 200 and 202).

To determine whether error-correction decoding has encountered a trapping set or is on the path to converging on a valid codeword, error-correction decoding is run for a specified number K (e.g., 5) of local iterations. During the local iterations n=1, 2, . . . , K, the numbers NUSC of unsatisfied check nodes are observed. During local iteration n=K, the model is generated by fitting the negative exponential function to the trajectory followed by the observed numbers NUSC of unsatisfied check nodes (e.g., finding coefficients A and B of Equation (3)). Details of this curve fitting is discussed further below.

For each location iteration n after n=K, an extrapolated (i.e., predicted) number NUSC_extr(n) of unsatisfied check nodes is calculated using the model, and an offset value delta(n) is added to the extrapolated (i.e., predicted) number NUSC_extr(n) of unsatisfied check nodes to avoid false positives. Selection of the offset values delta(n) is discussed in further detail below. The observed number NUSC of unsatisfied check nodes for the local iteration n is then compared to NUSC_extr(n)+delta(n).

If the observed number NUSC of unsatisfied check nodes is greater than NUSC_extr(n)+delta(n), then the local iterations of error-correction decoding are stopped. Otherwise, the local iterations of error-correction decoding continue until (i) error-correction decoding converges on a valid codeword, (ii) the observed number NUSC of unsatisfied check nodes is greater than NUSC_extr(n)+delta(n), or (iii) the maximum number $N_{max}$ (e.g., 100 or even infinity) of local iterations is completed. Note that, according to some embodiments, $N_{max}$ is selected as a back-up to prevent over-spending of resources by the error-correction decoder. In most, if not all cases, the local iterations will be stopped due to either (i) convergence on a valid codeword or (ii) detection of a trapping set.

As an example of this operation, refer to FIG. 2. Suppose that curve 200 is generated based on local iterations n=1, 2, . . . , 5. At local iteration n=6, the observed number NUSC of unsatisfied check nodes is above curve 200, indicating that error-correction decoding has likely encountered a trapping set. If the observed number NUSC of unsatisfied check nodes is greater than the extrapolated number NUSC_ext(n) of unsatisfied check nodes on curve 200 plus offset value delta(n), then local iterations after n=6 corresponding to the first global iteration would be not be performed (i.e., local iterations n=7, 8, . . . , $N_{max}$), and the second global iteration would be initiated.

Figure 3:
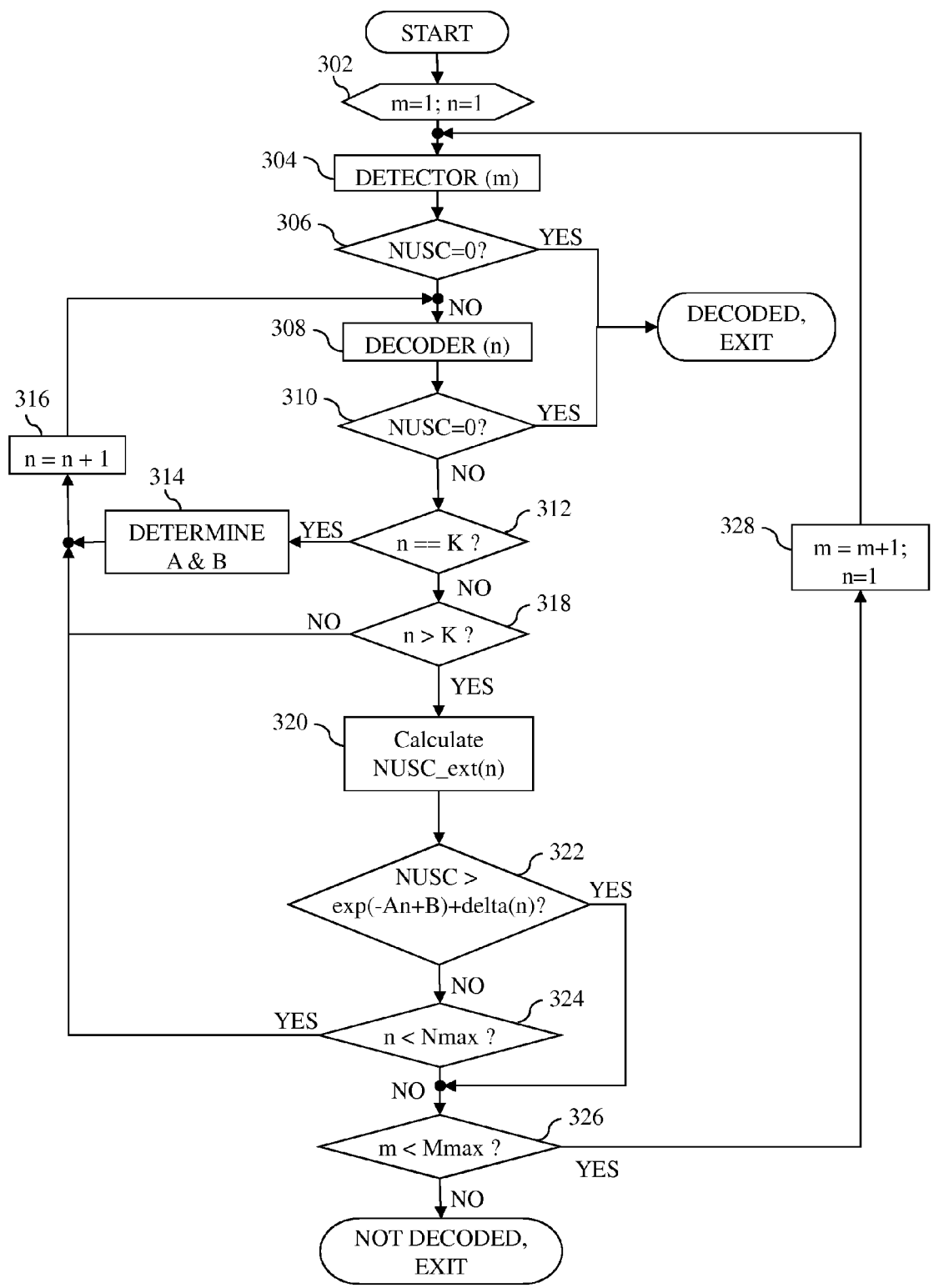
FIG. 3 shows a simplified flow diagram of a decoding operation performed by the iterative decoder of FIG. 1 according to one embodiment of the disclosure.

FIG. 3 shows a simplified flow diagram of a decoding operation performed by iterative decoder 100 according to one embodiment of the disclosure. Upon receiving the samples $y_i$ of a waveform to decode, the global iteration index m and the local iteration index n are both initialized to one (step 302). Channel detector 102 performs channel detection on the received samples $y_i$ to generate a set of soft-output values $L_{ch,i}$ (step 304).

A parity check is performed on the hard-decision bits of the soft-output values $L_{ch,i}$ to determine whether or not the number of unsatisfied check nodes is equal to zero (step 306). If the observed number NUSC of unsatisfied check nodes is equal to zero, then iterative decoder 100 has converged on a valid codeword, and decoding is terminated. If the observed number NUSC of unsatisfied check nodes is not equal to zero, then the soft-output values $L_{ch,i}$ are provided to error-correction decoder 104. Error-correction decoder 104 performs one local iteration of error-correction decoding on the soft-output values $L_{ch,i}$ to generate a set of updated soft-output values $P_i$ (step 308).

A parity check is performed on the hard decision bits $x_i$ of the updated soft-output values $P_i$ to determine whether or not the observed number NUSC of unsatisfied check nodes is equal to zero (step 310). If the observed number NUSC of unsatisfied check nodes is equal to zero, then iterative decoder 100 has converged on a valid codeword, and decoding is terminated. If the observed number NUSC of unsatisfied check nodes is not equal to zero, then error-correction decoder 104 proceeds to step 312.

If the current local iteration n is equal to K (step 312), where K is a specified number of initial local iterations (e.g., 5), then error-correction decoder 104 has completed K local iterations without converging on a valid codeword, coefficients A and B of Equation (4) are calculated (step 314), and n is incremented (step 316) and processing returns to step 308 for the next local iteration.

If the current local iteration n is not equal to K (step 312), then it is determined whether the current local iteration n is greater than K (step 318). If not, then processing proceeds to step 316 to increment n for the next local iteration. If step 318 determines that the current local iteration n is greater than K, then the extrapolated number NUSC_extr(n) of unsatisfied check nodes is computed (step 320) using Equation (4) based on the variables A and B calculated in step 314, and the observed number NUSC of unsatisfied check nodes is compared to NUSC_extr(n)+delta(n) (step 322).

If step 322 determines that the observed number NUSC of unsatisfied check nodes is less than or equal to NUSC_extr(n)+delta(n), then processing proceeds to step 324 to determine whether or not the maximum number $N_{max}$ of local iterations (e.g., $N_{max}$=100 or even infinity) has been completed. If the maximum number $N_{max}$ of local iterations has not been completed, then the next local iteration is selected (step 316) and processing returns to step 308.

If the observed number NUSC of unsatisfied check nodes is greater than NUSC_extr(n)+delta(n) (step 322) or if the maximum number $N_{max}$ of local iterations has been completed (step 324), then processing proceeds to step 326 to determine whether or not the maximum number $M_{max}$ of global iterations has been completed. If the maximum number $M_{max}$ of global iterations has been completed, then processing is stopped, and further processing may be needed to decode the codeword. Otherwise, the next global iteration is selected (step 328), the local iteration index n is re-initialized to a value of one (step 328), and processing returns to step 304 to repeat the channel detection.

By limiting the number of local iterations performed when error-correction decoding encounters a trapping set, iterative decoder 100 can recover valid codewords faster using fewer computational resources and less processing power and while maintaining the same error rate than it would if iterative decoder 100 did not dynamically control the number of local iterations performed. Further, by permitting error-correction decoding to continue when error-correction decoding is on the path to converging on a valid codeword, iterative decoder 100 can recover valid codewords that it might not otherwise recover. Yet further, by permitting error-correction decoding to continue when error-correction decoding is on the path to converging on a valid codeword, iterative decoder 100 can recover valid codewords faster using fewer computational resources and less processing power than it otherwise would.

The details of the curve fitting in step 314 and the selection of offset values delta(n) will now be described. Fitting the negative exponential function to the trajectory followed by the observed numbers NUSC of unsatisfied check nodes may be performed using any suitable extrapolation technique, such as linear least squares extrapolation and polynomial extrapolation. For example, suppose that linear least squares extrapolation is used to generate the negative exponential function. Further, suppose that the negative exponential function is generated based on K=5 hypothetical data points ($NUSC_n$, n), where n=1, 2, . . . , 5. Linear least squares extrapolation finds a line ln(exp(−nA+B))=−nA+B that best fits these data five points. In other words, linear least squares extrapolation attempts to find the values for coefficients A and B that best solve Equations (4)-(8):

$$\ln(NUSC_1) = -A + B \quad (4)$$

$$\ln(NUSC_2) = -2A + B \quad (5)$$

$$\ln(NUSC_3) = -3A + B \quad (6)$$

$$\ln(NUSC_4) = -4A + B \quad (7)$$

$$\ln(NUSC_5) = -5A + B \quad (8)$$

To find the values for coefficients A and B, the minimum is found of Equation (9) below:

$$S(A,B) = [NUSC_1 - (-A+B)]^2 + [NUSC_2 - (-2A+B)]^2 + [NUSC_3 - (-3A+B)]^2 + [NUSC_4 - (-4A+B)]^2 + [NUSC_5 - (-5A+B)]^2 \quad (9)$$

by taking partial derivatives of S(A, B) with respect to A and B, setting the partial derivatives equal to zero, and solving the resulting system of equations to obtain equations for coefficients A and B.

The resulting equations for coefficients A and B may be implemented in step 314. For K=5, the resulting equations for coefficients A and B are shown in Equations (10) and (11), respectively:

$$A = -0.1a + 0.3b \quad (10)$$

$$B = 1.1b - 0.3a \quad (11)$$

where parameters "a" and "b" are represented by Equations (12) and (13), respectively:

$$a = \text{sum}(n \times \ln(NUSC(n))), n = 1, 2, \ldots, 5 \quad (12)$$

$$b = \text{sum}(\ln(NUSC(n))), n = 1, 2, \ldots, 5 \quad (13)$$

These equations vary for different values of K.

According to various embodiments of the disclosure, offset values delta(n) may be selected using a training operation that is performed either (i) after the iterative decoder is implemented in hardware but before the iterative decoder is put into operation (e.g., in a hard-disk drive) or (ii) after the iterative decoder is put into operation (e.g., as a part of hard-disk drive calibration process). Depending on the variations of decoders within a family of similar decoders, this training operation may be performed for each decoder in a decoder family, or may be performed using one decoder with the results being programmed into the remaining decoders in the family.

The training operation may be performed by running the iterative decoder for a large number of noisy sectors to collect statistics about the observed numbers NUSC of unsatisfied check nodes. In so doing, the iterative decoder is run within the range of noise levels for the given hard-disk drive under varying operating conditions. These operating conditions depend on factors such as operating temperature, age of a disk, type of magnetic head, etc. To further understand how the statistics are collected for each sector, consider FIG. 4.

Figure 4:
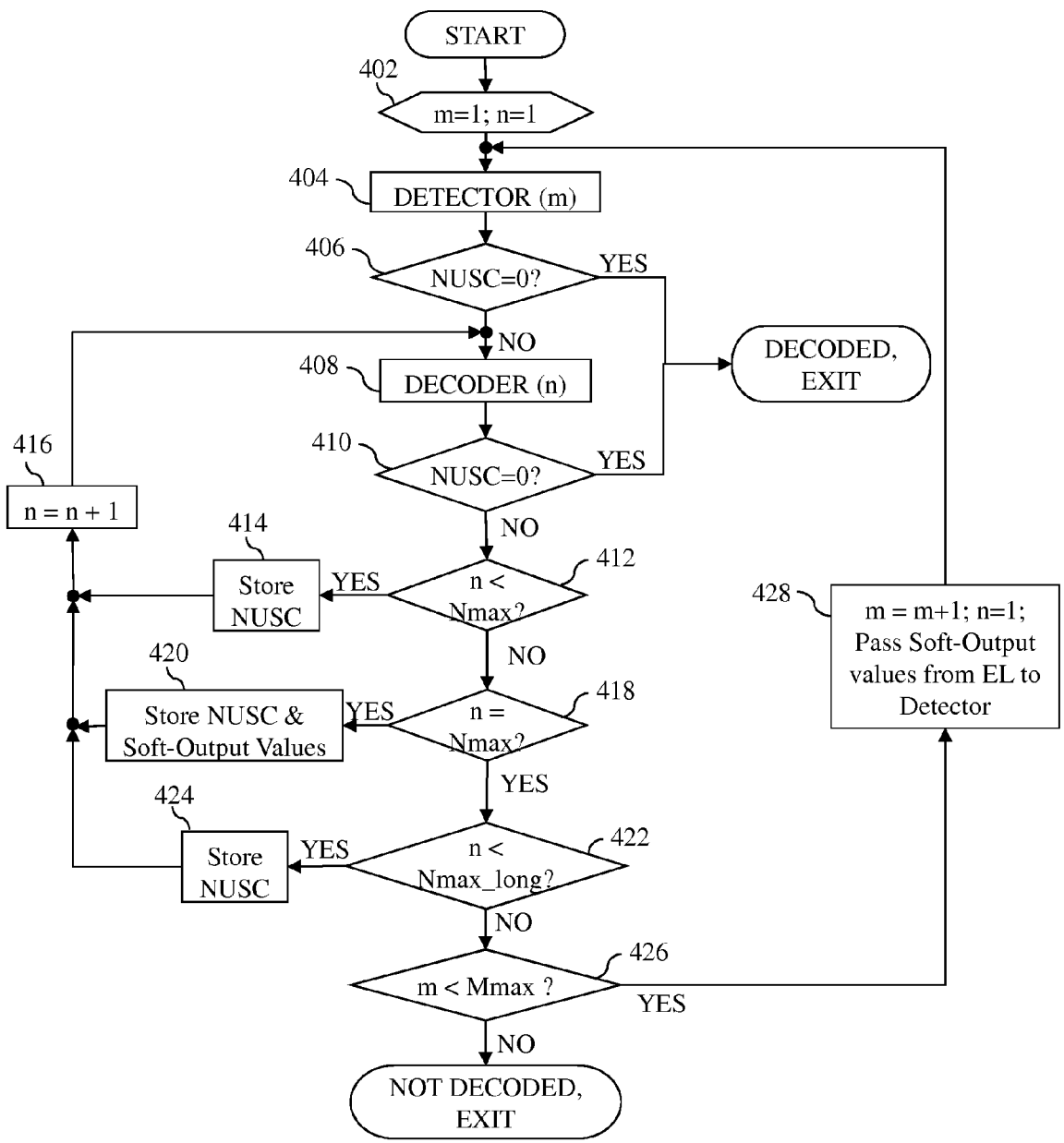
FIG. 4 shows a simplified flow diagram that may be used to collect statistics used for determining the offset values used in the flow diagram of FIG. 3 according to one embodiment of the disclosure.

FIG. 4 shows a simplified flow diagram that may be used to collect statistics used for determining the offset values delta(n) according to one embodiment of the disclosure. FIG. 4 is performed one time for each received codeword. Steps 402 to 410 are performed in a manner similar to that of steps 302 to 310 of FIG. 3, respectively. If the error-correction decoder does not successfully converge on a valid codeword (step 410), then one of four paths are taken based on the value of the local iteration index n.

First, if the local iteration number n is less than a predefined maximum number $N_{max}$ of local iterations (e.g., $N_{max}$=20), then the observed number NUSC of unsatisfied check nodes is stored for the local iteration n (step 414), the next local iteration is selected (step 416), and processing returns to step 408. Second, if the local iteration number n is equal to the predefined maximum number $N_{max}$ of local iterations (step 418), then the observed number NUSC of unsatisfied check nodes is stored for the local iteration n (step 420), the soft-output values $P_i$ of the decoder are stored (step 420), the next local iteration is selected (step 416), and processing returns to step 408. As discussed below, these stored soft-output values $P_i$ are subsequently used by the detector in the event that a subsequent global iteration is performed.

Third, if the local iteration number n is greater than the predefined maximum number $N_{max}$ of local iterations (step 418) but less than an extended maximum number $N_{max\_long}$ of local iterations (step 422), then the observed number NUSC of unsatisfied check nodes is stored for the local iteration n (step 424), the next local iteration is selected (step 416), and processing returns to step 408. Note that local iterations n in between $N_{max}$ and $N_{max\_long}$ are performed merely for statistics collection purposes. The soft-output values $P_i$ produced from these local iterations are not used for subsequent global iterations.

Fourth, if the local iteration number n is greater than the predefined maximum number $N_{max}$ of local iterations (steps 412 and 418) and not less than the extended maximum number $N_{max\_long}$ of local iterations (e.g., 100) (step 422), then a determination is made (step 426) as to whether or not to perform another global iteration m by comparing the global iteration index m to a predefined maximum number $M_{max}$ of global iterations. If the global iteration index m is less than the predefined maximum number $M_{max}$ of global iterations, then the next global iteration is selected (step 428), the local iteration index n is re-initialized (step 428), and the stored soft-output values from step 420 are provided to the channel detector (step 428). Processing then returns to step 404.

After the observed numbers NUSC of unsatisfied check nodes are collected for a set of codewords, a probability distribution of NUSC(n) is estimated for each successful and unsuccessful local iteration n. Then, for each local iteration n, delta(n) is defined such that the Bayesian rule is met as shown below in Equation (14):

$$P_{succ}(NUSC\_ext(n) + \text{delta}(n)) \times P_{apriori\_succ} = P_{unsucc}$$
$$(NUSC\_ext(n) + \text{delta}(n)) \times P_{apriori\_unsucc} \quad (14)$$

where $P_{apriory\_succ}$ (e.g., 0.5) and $P_{apriory\_unsucc}$ (e.g., 0.5) are heuristically defined a priori probabilities of success and non-success for local iteration, and $P_{apriory\_succ} + P_{apriory\_unsucc} = 1$, $P_{succ}$ is a probability of converging at the $n^{th}$ local iteration if NUSC(n) is equal to the argument of this function, and $P_{unsucc}$ is a probability of not converging at the $n^{th}$ local iteration if NUSC(n) is equal to the argument of this function.

It has been found that, if all offset values delta(n) are set to the same fixed value (e.g. delta(n)=20 for all n), then the above-described Bayesian rule is almost satisfied for a priori probabilities equal to 0.5. By setting both a priori probabilities equal to 0.5, the probability of a false detection of a trapping set that results in local iterations being terminated prematurely is approximately equal to the probability of a false non-detection of a trapping set that results in local iterations being continued when error-the correction decoder has no change of converging on a valid codeword.

Embodiments of the disclosure may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, micro-controller, or general-purpose computer.

Embodiments of the invention can be embodied in the form of methods and apparatuses for practicing those methods. Embodiments of the invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. Embodiments of the invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which are described and illustrated in order to explain embodiments of the invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An apparatus comprising an iterative decoder adapted to perform one or more global iterations of decoding to recover a valid codeword from a received signal, the iterative decoder comprising:
   a channel detector adapted to perform, for each global iteration, channel detection on the received signal to generate a set of channel soft-output values, wherein each soft-output value corresponds to a different bit of the valid codeword;
   an error-correction decoder adapted to perform, for each global iteration:
   (i) a first local iteration of error-correction decoding on the set of channel soft-output values to generate a set of updated soft-output values; and
   (ii) one or more subsequent local iterations of error-correction decoding, wherein the error-correction decoder performs, for each subsequent local iteration of error-correction decoding, decoding on a set of updated soft-output values generated by the error-correction decoder during a previous local iteration of error-correction decoding to modify the set of updated soft-output values; and
   a controller adapted to dynamically control how many subsequent local iterations the error-correction decoder performs when the error-correction decoder does not generate the valid codeword.

2. The apparatus of claim 1, wherein, when the controller determines that the iterative decoder has encountered a trapping set during a current local iteration of a current global iteration, the controller dynamically terminates the current global iteration without performing a subsequent local iteration of the current global iteration.

3. The apparatus of claim 2, wherein:
   the controller predicts a number of unsatisfied check nodes that should be observed by the error-correction decoder for the current local iteration when the error-correction decoder is converging on the valid codeword; and
   the controller determines whether or not the error-correction decoder has encountered a trapping set based on a comparison of an observed number of unsatisfied check nodes for the current local iteration and the predicted number of unsatisfied check nodes for the current local iteration.

4. The apparatus of claim 3, wherein the controller generates the predicted number of unsatisfied check nodes using a function generated by:
   (i) performing K local iterations, where K is an integer greater than 1;
   (ii) observing a number of unsatisfied check nodes for each of the K local iterations;
   (iii) fitting the function to the observed numbers of unsatisfied check nodes for the K local iterations.

5. The apparatus of claim 4, wherein the function is a negative exponential function.

6. The apparatus of claim 5, wherein the function is:

$$NUSC\_extr(n)=\exp(-An+B), \text{ where}$$

NUSC_extr(n) is the predicted number of unsatisfied check nodes for local iteration n; and
   A and B are coefficients that are determined by fitting the function to the observed numbers of unsatisfied check nodes for the K local iterations.

7. The apparatus of claim 4, wherein the controller is further adapted to:
   (iv) determine, for each local iteration after the $K^{th}$ local iteration, a predicted number of unsatisfied check nodes for the local iteration based on the function;
   (v) compare an observed number of unsatisfied check nodes for the local iteration to a sum of the predicted number of unsatisfied check nodes for the local iteration and an offset value; and
   (vi) determine whether or not the error-correction decoder has encountered a trapping set based on the comparison.

8. The apparatus of claim 7, wherein the controller determines that the error-correction decoder has encountered a trapping set when the observed number of unsatisfied check nodes for the local iteration is greater than the sum of the predicted number of unsatisfied check nodes for the local iteration and the offset value.

9. The apparatus of claim 8, wherein the offset value is selected such that a probability of a false detection of a trapping set is approximately equal to a probability of a false non-detection of a trapping set.

10. The apparatus of claim 1, wherein the apparatus is an integrated circuit.

11. A processor implemented method for performing one or more global iterations of decoding to recover a valid codeword from a received signal, the method comprising:
   (a) performing, for each global iteration, channel detection on the received signal to generate a set of channel soft-output values, wherein each soft-output value corresponds to a different bit of the valid codeword;

(b) performing, for each global iteration, a first local iteration of error-correction decoding on the set of channel soft-output values to generate a set of updated soft-output values; and (c) performing, for each global iteration, one or more subsequent local iterations of error-correction decoding, wherein, for each subsequent local iteration of error-correction decoding, error-correction decoding is performed on a set of updated soft-output values generated during a previous local iteration of error-correction decoding to modify the set of updated soft-output values; and (d) dynamically controlling how many subsequent local iterations of error-correction decoding are performed when error-correction decoding does not generate the valid codeword.

12. The method of claim 11, wherein, when step (d) determines that error-correction decoding has encountered a trapping set during a current local iteration of a current global iteration, step (d) comprises dynamically terminating the current global iteration without performing a subsequent local iteration of the current global iteration.

13. The method of claim 12, wherein step (d) comprises:
(d1) predicting a number of unsatisfied check nodes that should be observed for the current local iteration of error-correction decoding when error-correction decoding is converging on the valid codeword; and
(d2) determining whether or not error-correction decoding has encountered a trapping set based on a comparison of an observed number of unsatisfied check nodes for the current local iteration and the predicted number of unsatisfied check nodes for the current local iteration.

14. The method of claim 13, wherein step (d1):
(d1i) performing K local iterations, where K is an integer greater than 1;
(d1ii) observing a number of unsatisfied check nodes for each of the K local iterations;
(d1iii) fitting the function to the observed numbers of unsatisfied check nodes for the K local iterations; and
(d1iv) generating the predicted number of unsatisfied check nodes using the function.

15. The method of claim 14, wherein the function is a negative exponential function.

16. The method of claim 15, wherein the function is:

$NUSC\_extr(n)=\exp(-An+B)$, where

NUSC_extr(n) is the predicted number of unsatisfied check nodes for local iteration n; and A and B are coefficients that are determined by fitting the function to the observed numbers of unsatisfied check nodes for the K local iterations.

17. The method of claim 14, wherein step (d2) comprises:
(d2i) determining, for each local iteration after the $K^{th}$ local iteration, a predicted number of unsatisfied check nodes for the local iteration based on the function;
(d2ii) comparing an observed number of unsatisfied check nodes for the local iteration to a sum of the predicted number of unsatisfied check nodes for the local iteration and an offset value; and
(d2iii) determining whether or not error-correction decoding has encountered a trapping set based on the comparison.

18. The method of claim 17, wherein step (d2iii) comprises determining that error-correction decoding has encountered a trapping set when the observed number of unsatisfied check nodes for the local iteration is greater than the sum of the predicted number of unsatisfied check nodes for the local iteration and the offset value.

19. The method of claim 18, wherein the offset value is selected such that a probability of a false detection of a trapping set is approximately equal to a probability of a false non-detection of a trapping set.

* * * * *